US008009071B2

(12) United States Patent
Sundblad (10) Patent No.: US 8,009,071 B2
(45) Date of Patent: Aug. 30, 2011

(54) GAIN CIRCUIT

(75) Inventor: Rolf Sundblad, Ljungsbro (SE)

(73) Assignee: Zoran Corporation, Sunnyvale, CA (US)

( * ) Notice: Subject to any disclaimer, the term of this patent is extended or adjusted under 35 U.S.C. 154(b) by 13 days.

(21) Appl. No.: 12/636,249

(22) Filed: Dec. 11, 2009

(65) Prior Publication Data

US 2011/0140945 A1    Jun. 16, 2011

(51) Int. Cl.
 *H03M 1/00*   (2006.01)
(52) U.S. Cl. .................. 341/138; 327/337; 327/344
(58) Field of Classification Search .................. 327/337, 327/344; 341/138, 155, 156
 See application file for complete search history.

(56) References Cited

U.S. PATENT DOCUMENTS

| RE35,379 | E | 11/1996 | Nicollini |
| 6,049,247 | A | 4/2000 | Krymski |
| 7,138,848 | B2 * | 11/2006 | Wu et al. .................. 327/337 |
| 2007/0080842 | A1 * | 4/2007 | Kawahito ................. 341/155 |
| 2009/0039956 | A1 * | 2/2009 | Mo .................................. 330/9 |

OTHER PUBLICATIONS

European Search Report from EP 08 15 8212, date of completion Nov. 4, 2008.
Bavel N Van et al; "ISDN U Transceiver Analog Front-End" Proceedings of the Custom Integrated Circuits Conference. Boston, May 13-16, 1990 [Proceedings of the Custom Integrated Circuits Conference], New York IEEE, US, vol. Conf. 12 May 13, 1990, pp. 1211-1215, XP000167685 * figure 5*.
Alladi D J et al: "An IC for closed-loop control of a micromotor with an electrostatically levitated rotor" Circuits and Systems, 1999. ISCAS '99. Proceedings of the 1999 IEEE International Symposium on Orlando, FL, USA May 31-Jun. 1, 1999, IEEE, Piscataway, NJ, USA, US, vol. 6, May 30, 1999, pp. 489-492, XP010341635 ISBN: 978-0-7803-5471-5 * figure 9 *.
Joo Goes et al: "Switched-Capacitor Multiply-By-Two Amplifier Insensitive to Component Mismatches" IEEE Transactions on Circuits and Systems II Express Briefs, IEEE Service Center, New York, NY, US, vol. 53, No. 1, Jan. 1, 2007, pp. 29-33, CP011156052 ISSN: 1057-7130 * figures 3,4 *.
Gusmeroli R et al: "A Switched-capacitor Neural Preamplifier with an Adjustable Pass-band for Fast Recovery following Stimultaion" Engineering in Medicine and Biology Society, 2006, EMBS '06, 28th Annual International Conference of the IEEE, IEEE, PI, Aug. 1, 2002, pp. 652-655, XP031186446 ISBN: 978-1-4244-0032-4 * figure 1 *.

* cited by examiner

*Primary Examiner* — Jean Jeanglaude
(74) *Attorney, Agent, or Firm* — Lando & Anastasi, LLP (57) ABSTRACT

A gain circuit comprises a main amplification unit and a first refresh unit. The main amplification unit comprises an amplifier, a first capacitor connected between a first input terminal of the gain circuit and a first input terminal of the amplifier, and a second capacitor connected between the first input terminal of the amplifier and a first output terminal of the amplifier. The first refresh unit comprises a first capacitor connected with a first terminal of the first capacitor to a common node of the first refresh unit, and a second capacitor connected with a first terminal of the second capacitor to the common node of the first refresh unit. The common node of the first refresh circuit is arranged to be supplied with a reference voltage ($V_{ref}$, $V_{cm,ref}$) during a first phase of a refresh interval and connected to the first input terminal of the amplifier during a second phase of the refresh interval.

21 Claims, 4 Drawing Sheets

GAIN CIRCUIT

TECHNICAL FIELD

The present invention relates to a gain circuit.

BACKGROUND

A gain circuit, or amplifier circuit, may e.g. be used in an input interface of an electronic circuit, such as e.g. a receiver circuit, analog-to-digital converter, etc. The purpose of the gain circuit may e.g. be to amplify or restore a signal level of a received signal before further processing of the signal in the analog and/or the digital domain.

Figure 1:
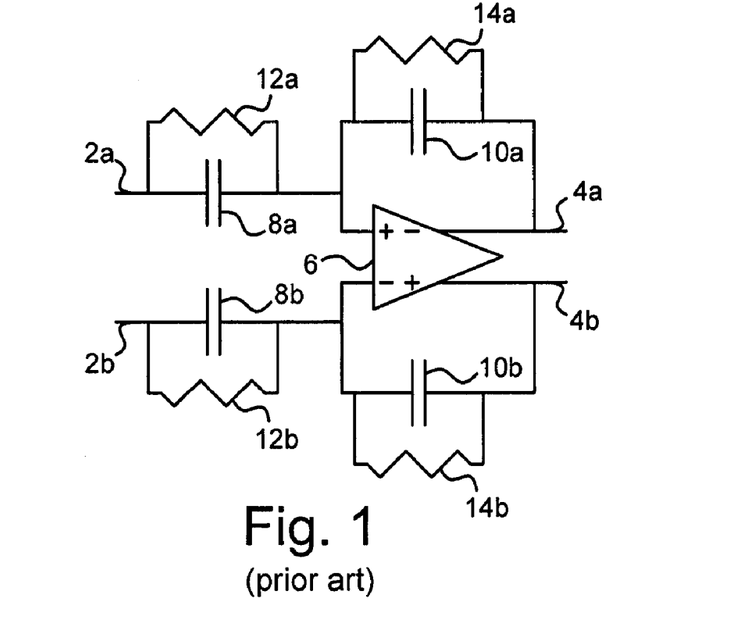
FIG. 1 is a circuit diagram of a prior-art gain circuit.

To obtain a relatively high linearity, the gain circuit may comprise an amplifier with high-gain, such as an operational amplifier (OP) or operational transconductance amplifier (OTA), connected in a feedback configuration. FIG. 1 is an exemplary circuit diagram of such a prior-art gain circuit. The gain circuit in FIG. 1 has a differential input terminals 2a and 2b, and differential output terminals 4a and 4b. An OP 6 is connected in a feedback configuration. A capacitor 8a is connected between the input terminal 2a and the positive input terminal of the OP 6. A capacitor 8b is connected between the input terminal 2b and the negative input terminal of the OP 6. A capacitor 10a is connected between the negative output terminal and the positive input terminal of the OP 6. A capacitor 10b is connected between the positive output terminal and the negative input terminal of the OP 6.

Resistors 12a-b and 14a-b are included in the gain circuit in FIG. 1 to provide a DC path to the positive and negative input terminals of the OP 6 from actively driven nodes, such as e.g. the output terminals of the OP 6. Thereby, charge can be transferred to and from the nodes connected to the input terminals of the OP 6 and a proper operating point for the input terminals of the OP 6 can be provided.

One problem with the gain circuit illustrated in FIG. 1 is that it may not be sufficiently linear for some applications, such as when the gain circuit is used as a pre amplifier in a high-resolution ADC. In particular, this may be a problem if a high signal bandwidth is targeted. As a nonlimiting example, in some video applications, a 10-bit resolution and up to 270 MHz sampling rate, or even higher, may be required. In such applications, the gain circuit depicted in FIG. 1 may be insufficient.

Furthermore, if the RC-constants of the parallel connections of resistor 12a and capacitor 8a, resistor 12b and capacitor 8b, resistor 14a and capacitor 10a, and resistor 14b and capacitor 10b are equal, a constant frequency response of the gain circuit in FIG. 1 is obtained (neglecting nonidealities in the OP 6). However, due to mismatch between components, said RC constants will normally not be equal. Therefore, the frequency response of the gain circuit may not be sufficiently flat for some applications.

In view of the above, there is a need for an improved gain circuit.

SUMMARY

Accordingly, an object of the present invention is to mitigate, alleviate or eliminate one or more of the above-identified deficiencies and disadvantages.

According to a first aspect, a gain circuit comprises a main amplification unit and a first refresh unit. The main amplification unit comprises an amplifier, a first capacitor connected between a first input terminal of the gain circuit and a first input terminal of the amplifier, and a second capacitor connected between the first input terminal of the amplifier and a first output terminal of the amplifier. The first refresh unit comprises a first capacitor connected with a first terminal of the first capacitor to a common node of the first refresh unit, and a second capacitor connected with a first terminal of the second capacitor to the common node of the first refresh unit. The common node of the first refresh circuit is arranged to be supplied with a reference voltage during a first phase of a refresh interval and connected to the first input terminal of the amplifier during a second phase of the refresh interval. Furthermore, a second terminal of the first capacitor of the first refresh unit is arranged to be supplied with an input voltage of the gain circuit during the first phase of the refresh interval and connected to the first input terminal of the gain circuit during the second phase of the refresh interval. Moreover, a second terminal of the second capacitor of the first refresh unit is arranged to be supplied with a first voltage, which is an output voltage or output reference voltage of the amplifier, during the first phase of the refresh interval and connected to the first output terminal of the amplifier during the second phase of the refresh interval.

The gain circuit may be single ended. Said input voltage supplied to the second input terminal of the first capacitor in the first refresh unit may be the voltage on the first input terminal of the gain circuit. Furthermore, said first voltage supplied to the second terminal of the second capacitor in the first refresh unit may be the voltage on the first output terminal of the amplifier.

The ratio between the capacitance of the first capacitor in the main amplification unit and the capacitance of the second capacitor in the main amplification unit may be essentially equal to the ratio between the capacitance of the first capacitor in the first refresh unit and the capacitance of the second capacitor in the first refresh unit.

Alternatively, the gain circuit may be fully differential. The main amplification unit may comprise a third capacitor connected between a second input terminal of the gain circuit and a second input terminal of the amplifier. Furthermore, the main amplification unit may comprise a fourth capacitor connected between the second input terminal of the amplifier and a second output terminal of the amplifier. The gain circuit may comprise a second refresh unit. The second refresh unit may comprise a first capacitor connected with a first terminal of the first capacitor to a common node of the second refresh unit. Furthermore, the second refresh unit may comprise a second capacitor connected with a first terminal of the second capacitor to the common node of the second refresh unit. The common node of the second refresh unit may be arranged to be supplied with a reference voltage during the first phase of the refresh interval and connected to the second input terminal of the amplifier during a second phase of the refresh interval. Furthermore, a second terminal of the first capacitor of the second refresh unit may be arranged to be supplied with an input voltage of the gain circuit during the first phase of the refresh interval and connected to the second input terminal of the gain circuit during the second phase of the refresh interval. Moreover, a second terminal of the second capacitor of the second refresh unit may be arranged to be supplied with a second voltage, which may be an output voltage or output reference voltage of the amplifier, during the first phase of the refresh interval and connected to the second output terminal of the amplifier during the second phase of the refresh interval.

The ratio between the capacitance of the first capacitor in the main amplification unit and the capacitance of the second capacitor in the main amplification unit may be essentially equal to the ratio between the capacitance of the first capacitor in the first refresh unit and the capacitance of the second capacitor in the first refresh unit, and the ratio between the capacitance of the third capacitor in the main amplification unit and the capacitance of the fourth capacitor in the main amplification unit may be essentially equal to the ratio between the capacitance of the first capacitor in the second refresh unit and the capacitance of the second capacitor in the second refresh unit.

Said first voltage and said second voltage may both be a common-mode output voltage of the amplifier.

The input voltage that may be supplied to the second terminal of the first capacitor in the first refresh unit and the input voltage that may be supplied to the second terminal of the first capacitor in the second refresh unit may both be a common-mode input voltage of the gain circuit.

Alternatively, the input voltage that may be supplied to the second terminal of the first capacitor in the first refresh unit may be the voltage on the first input terminal of the gain circuit, and the input voltage supplied to the second terminal of the first capacitor in the second refresh unit may be the voltage on the second input terminal of the gain circuit.

The first refresh unit may comprise a third capacitor connected with a first terminal of the third capacitor to the common node of the first refresh unit, and a second terminal of the third capacitor may be arranged to be supplied with the voltage on the second input terminal of the gain circuit during the first phase of the refresh interval and connected to the first input terminal of the gain circuit during the second phase of the refresh interval. Similarly, the second refresh unit may comprise a third capacitor connected with a first terminal of the third capacitor to the common node of the second refresh unit, and a second terminal of the third capacitor may be arranged to be supplied with the voltage on the first input terminal of the gain circuit during the first phase of the refresh interval and connected to the second input terminal of the gain circuit during the second phase of the refresh interval. The ratio between the capacitance of the first capacitor in the main amplification unit and the capacitance of the second capacitor in the main amplification unit may be essentially equal to the ratio between the sum of the capacitances of the first and third capacitor in the first refresh unit and the capacitance of the second capacitor in the first refresh unit, and the ratio between the capacitance of the third capacitor in the main amplification unit and the capacitance of the fourth capacitor in the main amplification unit may be essentially equal to the ratio between the sum of the capacitances of the first and third capacitor in the second refresh unit and the capacitance of the second capacitor (175b) in the second refresh unit (130b).

The gain circuit may be a programmable-gain amplifier. For example, the main amplification unit may comprise additional capacitors that may be selectively connected in parallel with the first, second, third, and/or fourth capacitor of the main amplification unit for adjusting the gain of the gain circuit.

According to a second aspect, an analog-to-digital converter (ADC) comprises a gain circuit according to the first aspect. 16. The may comprise a track-and-hold circuit connected with an input terminal of the track-and-hold circuit to the first output terminal of the amplifier in the main amplification unit of the gain circuit. The amplifier may comprise an output load circuit comprising a diode-connected transistor connected to the first output terminal and biased with a DC current. The track-and-hold circuit may comprise a switch transistor of the same type as the diode-connected transistor (260). The diode-connected transistor may be arranged to generate a control voltage to the switch transistor during a track phase of the track-and-hold circuit on a gate terminal of the diode-connected transistor.

According to a third aspect, an integrated circuit comprises a gain circuit according to the first aspect.

According to a fourth aspect, an electronic apparatus comprises a gain circuit according to the first aspect. The electronic apparatus may e.g. be, but is not limited to, a television set, a liquid-crystal display, a computer monitor, a digital camera, a projector, or a radio receiver.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of embodiments, reference being made to the accompanying drawings, in which.

DETAILED DESCRIPTION

Figure 2:
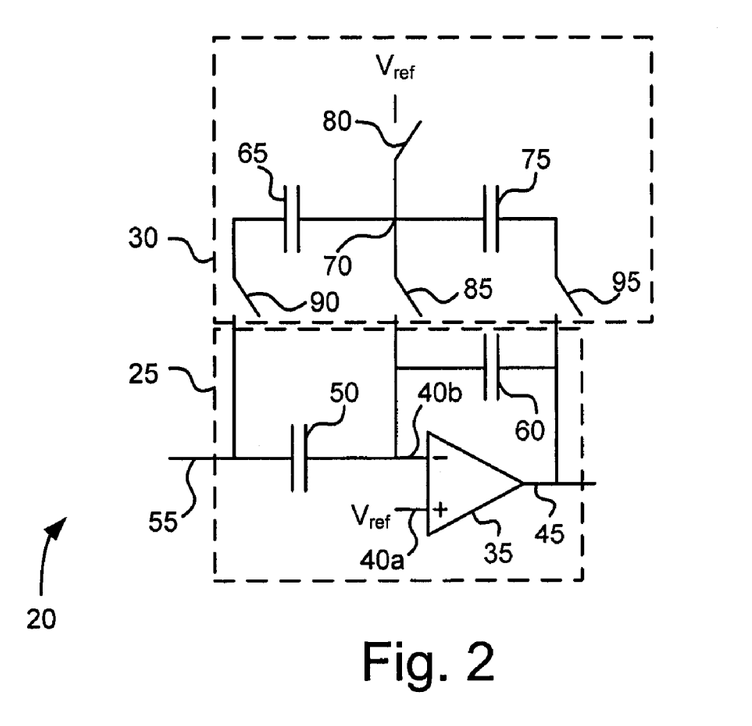
FIGS. 2-4 are circuit diagram of gain circuits according to embodiments.

FIG. 2 is a circuit diagram of a gain circuit 20 according to an embodiment. In the embodiment, the gain circuit 20 comprises a main amplification unit 25 and a refresh unit 30. The main amplification unit 25 comprises an amplifier 35. In the embodiment illustrated in FIG. 2, the gain circuit 20 is single ended. The amplifier 35 has a differential input with a positive input terminal 40a and a negative input terminal 40b, and a single-ended output terminal 45. The positive input terminal 40a is supplied with a reference voltage $V_{ref}$. The amplifier 35 illustrated in FIG. 2 may e.g. be an operational amplifier (OP) or operational transconductance amplifier (OTA). According to other embodiments, the amplifier 35 may be an amplifier with a single-ended input and relatively high gain, such as e.g. a common-source amplifier or an inverter.

According to the embodiment illustrated in FIG. 2, the main amplification unit 30 comprises a capacitor 50 connected between an input terminal 55 of the gain circuit 20 and the negative input terminal 40b of the amplifier 35. Furthermore the main amplification unit 30 comprises a capacitor 60 connected between the negative input terminal 40b of the amplifier 35 and the output terminal 45 of the amplifier 35. According to some embodiments, the output terminal 45 of the amplifier 35 is also the output terminal of the gain circuit 20.

The refresh unit 30 may be adapted to "refresh" the charge in the node associated with the negative input terminal 40b of the amplifier 35 (i.e. the total charge on the plates of capacitors 60 and 50 that are connected to the negative input terminal 40b of the amplifier 35 and parasitic capacitance associated therewith) during periodically reoccurring refresh time intervals. Thereby, the refresh unit may be adapted to control the operating point of the amplifier 35 to make sure that the amplifier 35 operates in an appropriate operation region (e.g. without saturating etc.). By means of the refresh unit 30, the amplifier 35 can be operated in an appropriate operation region without the use of resistors, such as the resistors 14a-b and 12a-b in the prior-art gain circuit illustrated in FIG. 1. In accordance with the present invention, it has been realized that inclusion of resistors (e.g. resistors 14a-b and 12a-b in FIG. 1) in the load of the amplifier provides a major contribution to nonlinear behavior. For example, a resistive load, in contrast to purely capacitive load, draws a static current from the output of the amplifier. This, in turn, results in that the inherent nonlinearities of the amplifier, e.g. due to nonlinearities in transistors in the amplifier, are more prominent compared with when a purely capacitive load is used. Furthermore, e.g. due to skin effects, the resistors themselves are nonlinear as well. Therefore, the use of the refresh unit 30 facilitates a significantly improved linearity of the gain circuit 20. Furthermore, since resistors can be avoided, the frequency response of the gain circuit 20 can be made approximately "flat", or constant, over a considerably larger frequency range than e.g. for the prior-art gain circuit illustrated in FIG. 1, which is an advantage.

The refresh intervals may e.g. occur when no useful input signal is supplied to the gain circuit. For example, if the gain circuit 20 is used as a preamplifier in an analog-to-digital converter (ADC) for sampling analog video signals and converting them into a digital representation, the refresh intervals may occur between video frames, or between horizontal lines in a video frame, of said video signal.

In the embodiment illustrated in FIG. 2, the refresh unit 30 comprises a capacitor 65 connected with a first terminal to a common node 70 of the refresh unit 30. Furthermore, the refresh unit 30 comprises a capacitor 75 connected with a first terminal to the common node 70 of the refresh unit 30.

In a first phase of the refresh interval, the refresh unit 30 is arranged to charge the capacitors 65 and 75. In a second phase of the refresh interval, subsequent to said first phase, the refresh unit 30 is arranged to redistribute charge to the capacitors 50 and 60 of the main amplification unit 25. By appropriate selection of capacitance values and reference voltages, the amplifier 35 will gradually approach an appropriate operating point during consecutive refresh intervals. Appropriate selection of capacitance values and reference voltages may e.g. be derived based on circuit simulation and/or measurements.

According to the embodiment illustrated in FIG. 2, the common node 70 of the refresh unit 30 is arranged to be supplied with the reference voltage $V_{ref}$ during the first phase of the refresh interval by closing a switch device 80 and keeping another switch device 85 open. Furthermore, according to the embodiment, the common node 70 of the refresh unit 30 is arranged to be connected to the negative input terminal 40b of the amplifier 35 during the second phase of the refresh interval by closing the switch device 85 and keeping the switch device 80 open.

According to the embodiment, a second terminal of the capacitor 65 is arranged to be supplied with an input voltage of the gain circuit 20 during the first phase of the refresh interval. According to the embodiment, said input voltage is the voltage on the input terminal 55 of the gain circuit 20. The input voltage can be supplied to the second terminal of the capacitor 65 by closing a switch device 90 of the refresh unit 30.

According to the embodiment, the second terminal of the capacitor 65 is arranged to be connected to the input terminal 55 of the gain circuit 20 during the second phase of the refresh interval. This may be accomplished by closing the switch device 90 during the second phase of the refresh interval. According to the embodiment illustrated in FIG. 2, the refresh unit 30 comprises a single switch device 90 for selectively connecting the second terminal of the capacitor 65 to the input terminal 55 of the gain circuit 20 during the first and the second phase of the refresh interval. According to alternative embodiments, the refresh unit 30 may comprise separate switch devices (not shown) for selectively connecting the second terminal of the capacitor 65 to the input terminal 55 of the gain circuit 20 during the first and the second phase, respectively, of the refresh interval.

Furthermore, according to the embodiment illustrated in FIG. 2, a second terminal of the capacitor 75 is arranged to be supplied with an output-related voltage of the amplifier 35 during the first phase of the refresh interval. According to the embodiment, said output-related voltage is the voltage on the output terminal 45 of the amplifier 35. The output voltage may be supplied to the second terminal of the capacitor 75 by closing a switch device 95 during the first phase of the refresh interval. According to alternative embodiments, said output-related voltage supplied to the second terminal of the capacitor 75 may be an output DC reference voltage, or target DC output voltage, of the amplifier 35. The output DC reference voltage may e.g. be generated by a bias circuit (not shown) of the amplifier 35 or gain circuit 20.

According to the embodiment, the second terminal of the capacitor 75 is arranged to be connected to the output terminal 45 of the amplifier 35 during the second phase of the refresh interval. This may be accomplished by closing the switch device 95 during the second phase of the refresh interval. According to the embodiment illustrated in FIG. 2, the refresh unit 30 comprises a single switch device 95 for selectively connecting the second terminal of the capacitor 75 to the output terminal 45 of the amplifier 35 during the first and the second phase of the refresh interval. According to alternative embodiments, the refresh unit 30 may comprise separate switch devices (not shown) for selectively connecting the second terminal of the capacitor 75 to the output terminal 45 of the amplifier 35 during the first and the second phase, respectively, of the refresh interval.

According to some embodiments, the ratio between the capacitance of the capacitor 50 and the capacitance of the capacitor 60 is equal to the ratio between the capacitance of the capacitor 65 and the capacitance of the capacitor 75. However, the above-indicated relationship between the capacitance ratios is not completely necessary for appropriate operation of the circuit. For example, appropriate operation of the circuit may be obtained with other relationships between the capacitance ratios e.g. if the capacitances of the capacitors 65 and 75 are made considerably larger than the capacitances of the capacitors 50 and 60. As another example, appropriate operation of the circuit may also be obtained with other relationships between the capacitance ratios by supplying another voltage than $V_{ref}$ to the common node 70 of the refresh unit 30 during the first phase of the refresh interval. As stated above, suitable values for capacitances and reference voltages may e.g. be derived e.g. through circuit simulation and/or measurements. When manufacturing electronic components, such as capacitors, actual values of component parameters, such as capacitance, will deviate from intended values due to manufacturing inaccuracies. Hence, statements indicating that a capacitance ratio is equal to another capacitance ratio, when used in this specification, mean that the capacitance ratios are essentially or approximately equal, not necessarily exactly equal. Similarly, statements that circuit parameters, such as capacitances, are equal, when used in this specification, mean that the circuit parameters are essentially or approximately equal, not necessarily exactly equal.

Figure 3:
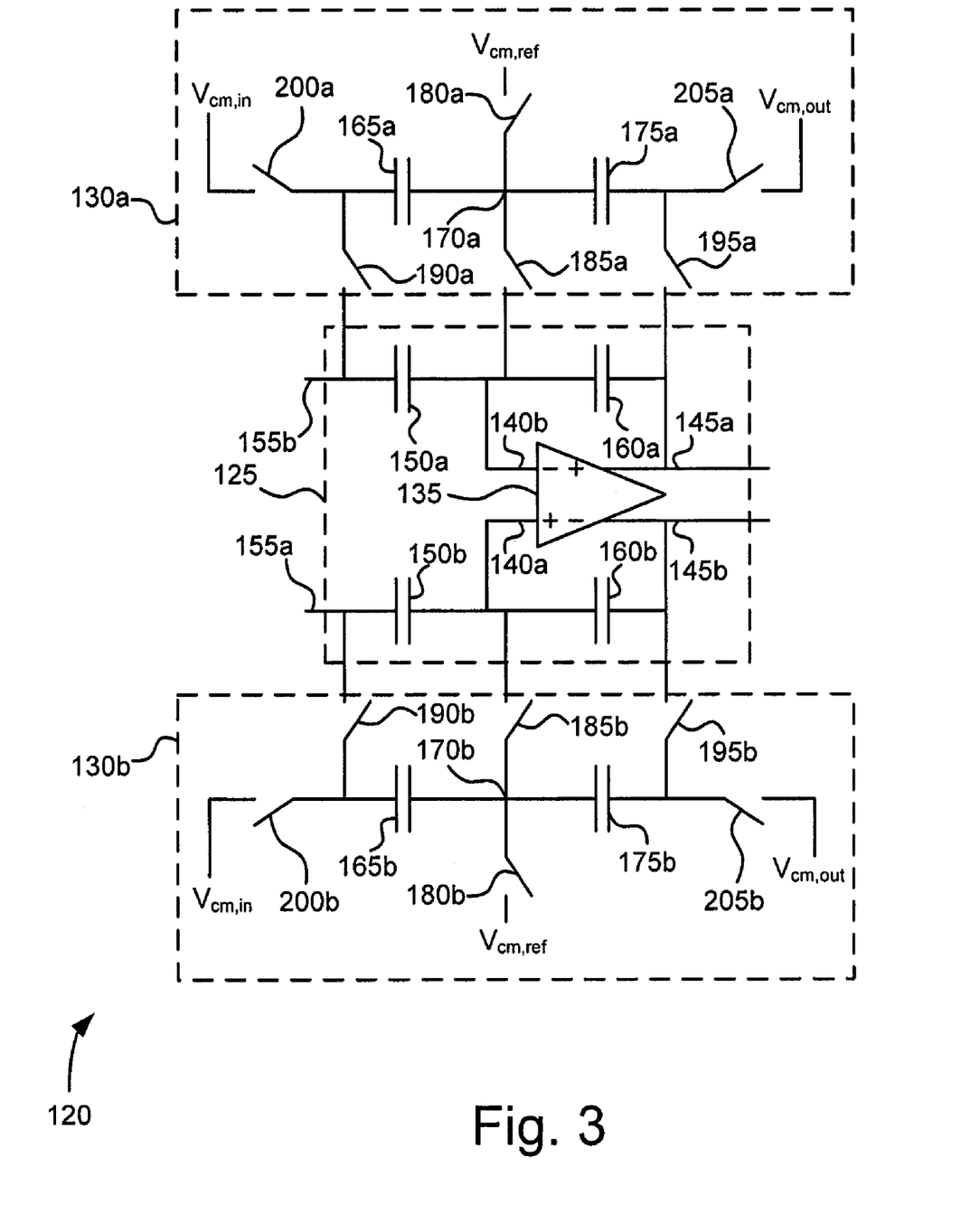

In the embodiment illustrated in FIG. 2, the gain circuit 20 is single ended. According to other embodiments, a fully differential gain circuit is provided. A circuit diagram of a fully differential gain circuit 120 according to an embodiment is shown in FIG. 3. According to the embodiment, the gain circuit 120 comprises a main amplification unit 125 and two refresh units 130a and 130b.

In the embodiment illustrated in FIG. 3, the main amplification unit 125 comprises an amplifier 135. The amplifier 135 may e.g. be a fully differential OP or OTA. The amplifier 135 has a positive input terminal 140a, a negative input terminal 140b, a positive output terminal 145a, and a negative output terminal 145b. According to some embodiments, the positive output terminal 145a and the negative output terminal 145b of the amplifier 135 are also the positive output terminal and the negative output terminal, respectively, of the gain circuit 120.

Furthermore, the main amplification unit 125 comprises a capacitor 150a connected between a negative input terminal 155b of the gain circuit 120 and the negative input terminal 140b of the amplifier 135, and a capacitor 150b connected between a positive input terminal 155a of the gain circuit 120 and the positive input terminal 140a of the amplifier 135. Moreover, the main amplification unit 125 comprises a capacitor 160a connected between the negative input terminal 140b of the amplifier 135 and the positive output terminal 145a of the amplifier 135, and a capacitor 160b connected between the positive input terminal 140a of the amplifier 135 and the negative output terminal 145b of the amplifier 135.

According to some embodiments, the ratio between the capacitance of the capacitor 150a and the capacitance of the capacitor 160a is equal to the ratio between the capacitance of the capacitor 150b and the capacitance of the capacitor 160b. As a nonlimiting example, the capacitances of the capacitors 150a and 150b may be equal and the capacitances of the capacitors 160a and 160b may be equal.

Similarly to the refresh unit 30 in the single-ended embodiment illustrated in FIG. 2, the refresh units 130a and 130b may be adapted to refresh the charges in the nodes associated with the negative input terminal 140b and the positive input terminal 140a, respectively, of the amplifier 135 during periodically reoccurring refresh time intervals. Thereby, the refresh units 130a and 130b may be adapted to control the operating point of the amplifier 135 such that the amplifier 135 operates in an appropriate operation region. This can be accomplished without the use of resistors. Hence, the refresh units 130a and 130b facilitates a significant linearity improvement for the gain circuit 120, e.g. compared with the prior-art gain circuit illustrated in FIG. 1. Furthermore, since resistors can be avoided, the frequency response of the gain circuit 120 can be made approximately "flat", or constant, over a considerably larger frequency range than e.g. for the prior-art gain circuit illustrated in FIG. 1, which is an advantage.

According to the embodiment illustrated in FIG. 3, the refresh unit 130a comprises a capacitor 165a connected with a first terminal of the capacitor 165a to a common node 170a of the refresh unit 130a. Furthermore, the refresh unit 130a comprises a capacitor 175a connected with a first terminal of the capacitor 175a to the common node 170a. Similarly, the refresh unit 130b comprises a capacitor 165b connected with a first terminal of the capacitor 165b to a common node 170b of the refresh unit 130b, and a capacitor 175b connected with a first terminal of the capacitor 175b to the common node 170b.

In a first phase of the refresh interval, the refresh units 130a and 130b are arranged to charge the capacitors 165a and 175a, and 165b and 175b, respectively. In a second phase of the refresh interval, subsequent to the first phase, the refresh units 130a and 130b are arranged to redistribute charge to the capacitors 150a and 160a, and 150b and 160b, respectively, of the main amplification unit 125. By appropriate selection of capacitance values and reference voltages, the amplifier 135 will gradually approach an appropriate operating point during subsequent refresh intervals. Appropriate selection of capacitance values and reference voltages may e.g. be derived based on circuit simulation and/or measurements.

According to the embodiment illustrated in FIG. 3, the common node 170a of the refresh circuit 130a and the common node 170b of the refresh unit 130b are arranged to be supplied with a common-mode reference voltage $V_{cm,ref}$ during the first phase of a refresh interval by closing switch devices 180a and 180b and keeping switch devices 185a and 185b open. Furthermore, according to the embodiment, the common node 170a of the refresh unit 130a is arranged to be connected to the negative input terminal 140b of the amplifier 135 during the second phase of the refresh interval by closing the switch device 185a and keeping the switch device 180a open. Similarly, the common node 170b of the refresh unit 130b is arranged to be connected to the positive input terminal 140a of the amplifier 135 during the second phase of the refresh interval by closing the switch device 185b and keeping the switch device 180b open.

According to the embodiment illustrated in FIG. 3, a second terminal of the capacitor 165a is arranged to be supplied with a common-mode input voltage $V_{cm,in}$ of the gain circuit 120 during the first phase of the refresh interval. The common-mode input voltage $V_{cm,in}$ may be supplied to the second terminal of the capacitor 165a by closing a switch 200a. According to other embodiments, another input voltage of the gain circuit 120, such as the voltage on the negative input terminal 155b or the positive input terminal 155a of the gain circuit 120, may be supplied to the second terminal of the capacitor 165a during the first phase of the refresh interval.

Similarly, a second terminal of the capacitor 165b is arranged to be supplied with the common-mode input voltage $V_{cm,in}$ of the gain circuit 120 during the first phase of the refresh interval. The common-mode input voltage $V_{cm,in}$ may be supplied to the second terminal of the capacitor 165b by closing a switch 200b. According to other embodiments, another input voltage of the gain circuit 120, such as the voltage on the positive input terminal 155a or the negative input terminal of the gain circuit 120, may be supplied to the second terminal of the capacitor 165a during the first phase of the refresh interval.

Furthermore, according to the embodiment illustrated in FIG. 3, the second terminal of the capacitor 165a is arranged to be connected to the negative input terminal 155b of the gain circuit 120 during the second phase of the refresh interval by closing a switch device 190a. Similarly, the second terminal of the capacitor 165b is arranged to be connected to the positive input terminal 155a of the gain circuit 120 during the second phase of the refresh interval by closing a switch device 190b.

Moreover, according to the embodiment illustrated in FIG. 3, a second terminal of the capacitor 175a is arranged to be supplied with a common-mode output voltage $V_{cm,out}$ of the amplifier 135 during the first phase of the refresh interval. For example, the common-mode output voltage $V_{cm,out}$ may be generated in a common-mode feedback (CMFB) circuit (not shown) of the amplifier 135. The common-mode output voltage $V_{cm,out}$ can be supplied to the second terminal of the capacitor 175a by closing a switch device 205a. According to other embodiments, another output-related voltage of the amplifier 135, such as the voltage on the positive output terminal 145a or the negative output terminal 145b of the amplifier 135, or a common-mode reference (or target) voltage of the amplifier 135, may be supplied to the second terminal of the capacitor 175a during the first phase of the refresh interval.

Similarly, according to the embodiment illustrated in FIG. 3, a second terminal of the capacitor 175b is arranged to be supplied with the common-mode output voltage $V_{cm,out}$ of the amplifier 135 during the first phase of the refresh interval. The common-mode output voltage $V_{cm,out}$ can be supplied to the second terminal of the capacitor 175b by closing a switch device 205b. According to other embodiments, another output-related voltage of the amplifier 135, such as the voltage on the positive output terminal 145a or the negative output terminal 145b of the amplifier 135, or a common-mode reference (or target) voltage of the amplifier 135, may be supplied to the second terminal of the capacitor 175b during the first phase of the refresh interval.

Furthermore, according to the embodiment illustrated in FIG. 3, the second terminal of the capacitor 175a is arranged to be connected to the positive output terminal 145a of the amplifier 135 during the second phase of the refresh interval by closing a switch device 195a. Similarly, the second terminal of the capacitor 175b is arranged to be connected to the negative output terminal 145b of the amplifier 135 during the second phase of the refresh interval by closing a switch device 195b.

The ratio between the capacitance of the capacitor 150a and the capacitance of the capacitor 160a may e.g. be equal to the ratio between the capacitance of the capacitor 165a and the capacitance of the capacitor 175a. Similarly, ratio between the capacitance of the capacitor 150b and the capacitance of the capacitor 160b may e.g. be equal to the ratio between the capacitance of the capacitor 165b and the capacitance of the capacitor 175b. Then, the operating point voltages on the positive input terminal 140a and the negative input terminal 140b of the amplifier 135 will approximately approach the common-mode reference voltage $V_{cm,ref}$ during consecutive refresh intervals. However, other relationships between the above mentioned capacitance ratios may also be used. The operating point voltages on the positive input terminal 140a and the negative input terminal 140b of the amplifier 135 may then approach a voltage other than $V_{cm,ref}$. Therefore, the value of $V_{cm,ref}$ should be carefully selected to ensure that the amplifier 135 approaches an appropriate operation region. Such selection may e.g. be performed by means of circuit simulation.

Figure 4:
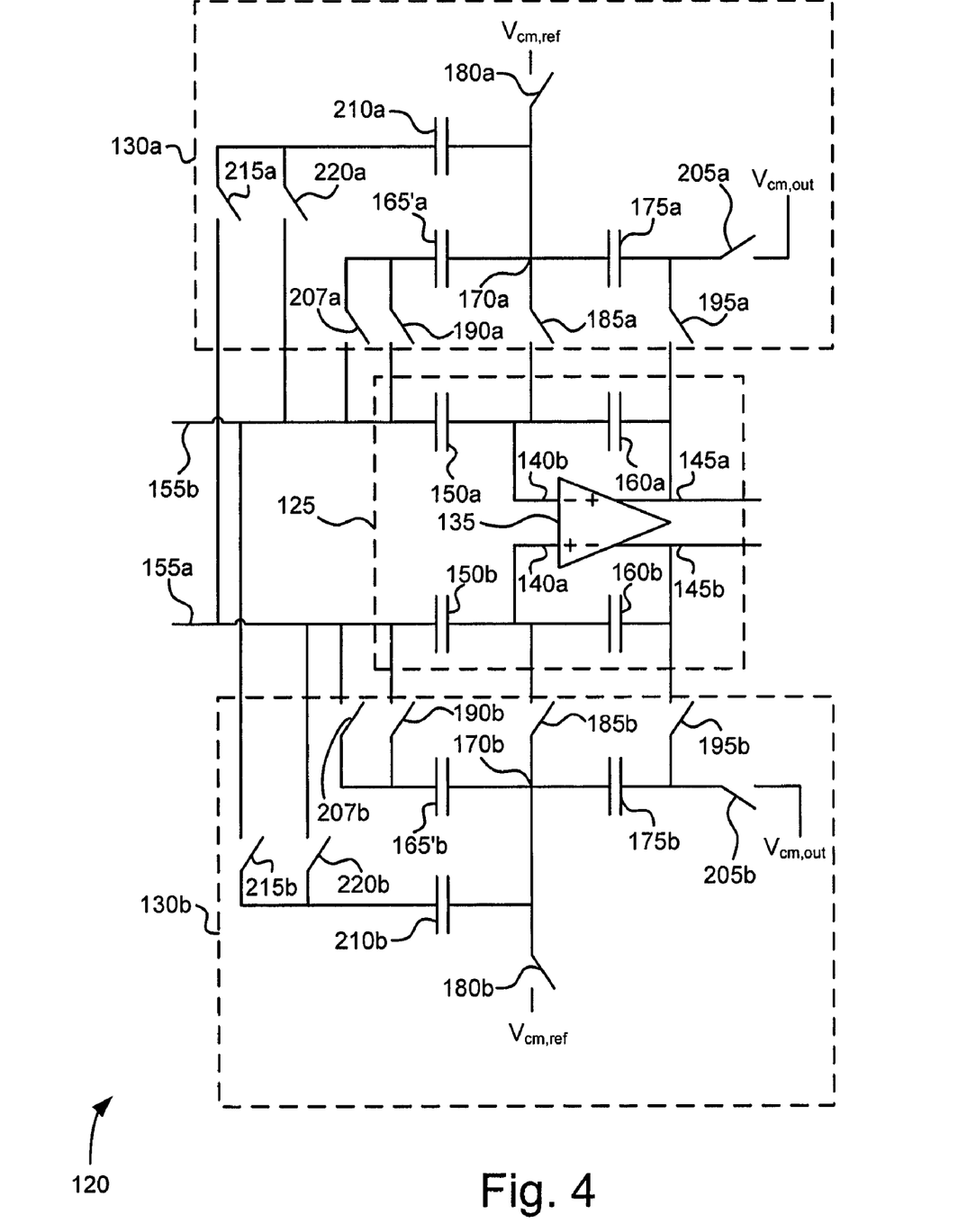

FIG. 4 shows a circuit diagram of another embodiment of the fully-differential gain circuit 120. Elements in FIG. 4 that are the same or similar to elements in FIG. 3 are denoted with the same or similar reference signs as in FIG. 3.

A difference between the embodiments illustrated in FIG. 4 and FIG. 3 is that in FIG. 4, the second terminals of the capacitors 165'a and 165'b are arranged to be supplied with the voltage on the negative input terminal 155b and the positive input terminal 155a, respectively, of the gain circuit 120 during the first phase of the refresh interval, instead of being supplied with the common-mode input voltage $V_{cm,in}$ as the second terminals of the capacitors 165a and 165b in the embodiment illustrated in FIG. 3. This can be accomplished by closing switch devices 207a and 207b. In alternative embodiments, the switch devices 207a and 207b may be omitted. Instead, the switch devices 190a and 190b may be utilized for selectively connecting the second terminals of the capacitors 165'a and 165'b to the negative input terminal 155b and the positive input terminal 155a, respectively, of the gain circuit both during the first phase of the refresh interval and during the second phase of the refresh interval.

Furthermore, according to the embodiment illustrated in FIG. 4, the refresh unit 130a comprises a capacitor 210a connected with a first terminal of the capacitor 210a to the common node 170a of the refresh unit 130a. A second terminal of the capacitor 210a is arranged to be supplied with the voltage on the positive input terminal 155a of the gain circuit 120 during the first phase of the refresh interval by closing a switch device 215a. Moreover, the second terminal of the capacitor 210a is arranged to be connected to the negative input terminal 155b of the gain circuit 120 during the second phase of the refresh interval by closing a switch device 220a.

Similarly, the refresh unit 130b comprises a capacitor 210b connected with a first terminal of the capacitor 210b to the common node 170b of the refresh unit 130b. A second terminal of the capacitor 210b is arranged to be supplied with the voltage on the negative input terminal 155b of the gain circuit 120 during the first phase of the refresh interval by closing a switch device 215b. Moreover, the second terminal of the capacitor 210b is arranged to be connected to the positive input terminal 155a of the gain circuit 120 during the second phase of the refresh interval by closing a switch device 220b.

If the capacitances of capacitors 210a and 165'a are equal and the capacitances of the capacitors 210b and 165'b are equal, approximately the same functionality is obtained as for the embodiment illustrated in FIG. 3, provided that the capacitance of the capacitor 165a (FIG. 3) is equal to the sum of the capacitances of the capacitors 165'a and 210a (FIG. 4) and the capacitance of the capacitor 165b (FIG. 3) is equal to the sum of the capacitances of the capacitors 165'b and 210b (FIG. 4). That is, connecting the second terminals of the capacitors 210a and 165'a (FIG. 4) to the positive input terminal 155a and negative input terminal 155b, respectively, of the gain circuit 120 mimics supplying the common-mode input voltage $V_{cm,in}$ to the second terminal of the capacitor 165a (FIG. 3). Similarly, connecting the second terminals of the capacitors 210b and 165'b (FIG. 4) to the negative input terminal 155b and positive input terminal 155a, respectively, of the gain circuit 120 mimics supplying the common-mode input voltage $V_{cm,in}$ to the second terminal of the capacitor 165b (FIG. 3).

The ratio between the capacitance of the capacitor 150a and the capacitance of the capacitor 160a may be equal to the ratio between the sum of the capacitances of the capacitors 165'a and 210a and the capacitance of the capacitor 175a. Furthermore, the ratio between the capacitance of the capacitor 150b and the capacitance of the capacitor 160b may be equal to the ratio between the sum of the capacitances of the capacitors 165'b and 210b and the capacitance of the capacitor 175b. Then, provided that the capacitances of capacitors 210a and 165'a are equal and the capacitances of the capacitors 210b and 165'b are equal, the operating point voltages on the positive input terminal 140a and the negative input terminal 140b of the amplifier 135 will approximately approach the common-mode reference voltage $V_{cm,ref}$ during consecutive refresh intervals. However, other relationships between the above mentioned capacitance ratios may also be used. As for the embodiment illustrated in FIG. 3, the operating point voltages on the positive input terminal 140a and the negative input terminal 140b of the amplifier 135 may then approach a voltage other than $V_{cm,ref}$. Therefore, the value of $V_{cm,ref}$ should be carefully selected to ensure that the amplifier 135 approaches an appropriate operation region. Such selection may e.g. be performed by means of circuit simulation.

In order to provide a suitable charge at the input terminal(s) of the amplifier 35 (FIG. 2) or 135 (FIGS. 3 and 4) during startup of the gain circuit 20 (FIG. 1) or 120 (FIG. 2), the switch devices 80 and 85 (FIG. 2) may be simultaneously closed during a short time interval during the startup, the switch devices 180a and 185a (FIGS. 3 and 4) may be simultaneously closed during a short time interval during the startup, and the switch devices 180b and 185b (FIGS. 3 and 4) may be simultaneously closed during a short time interval during the startup.

The embodiments described so far concern gain circuits with fixed gain. For example, for the embodiment illustrated in FIG. 2, the voltage gain of the gain circuit 20 is $-C_{50}/C_{60}$, where $C_{50}$ and $C_{60}$ denotes the capacitance of the capacitors 50 and 60, respectively. Similarly, for the embodiments illustrated in FIGS. 3 and 4, the voltage gain of the gain circuit 120 is $-C_{150a}/C_{160a}=-C_{150b}/C_{160b}$, where $C_{150a}$, $C_{160a}$, $C_{150b}$, and $C_{160a}$ denotes the capacitance of the capacitors 150a, 160a, 150b, and 160b, respectively. This expression for the voltage gain is valid provided that the ratio between the capacitances of the capacitors 150a and 160a is equal to the ratio between the capacitances of the capacitors 150b and 160b.

Figure 5:
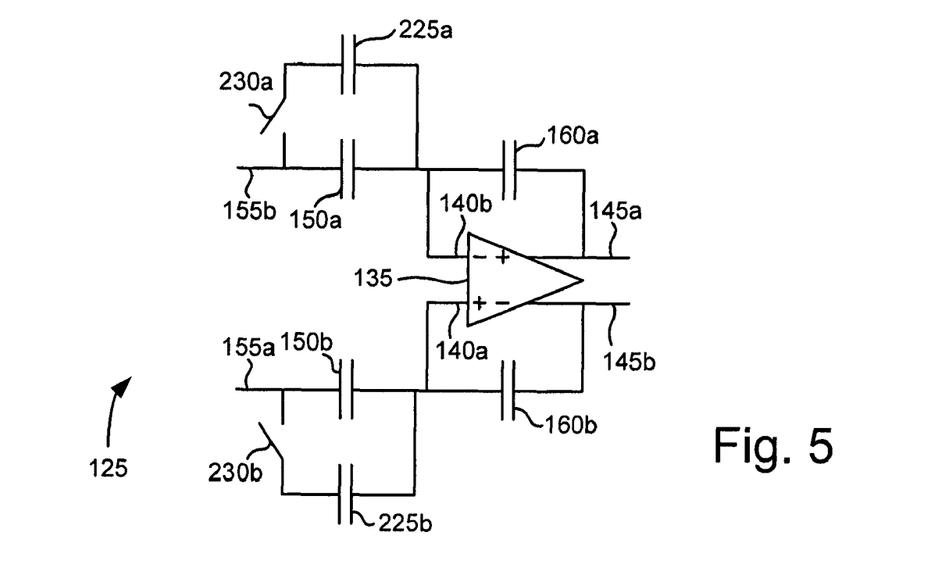
FIG. 5 is a circuit diagram of a main amplification unit according to an embodiment.

According to other embodiments, gain circuits with a variable gain are provided. For example, the gain circuit may be a programmable-gain amplifier (PGA). FIG. 5 shows a circuit diagram of an embodiment of the main amplification unit 125 in a fully-differential gain circuit 120, wherein the gain circuit 120 is a PGA. In addition to components included in the embodiments of FIGS. 3 and 4, the embodiment of the main amplification unit 135 illustrated in FIG. 5 further includes a capacitor 225a and a capacitor 225b. The capacitor 225a may be selectively connected in parallel with the capacitor 160a by closing a switch device 230a. Similarly, the capacitor 225b may be selectively connected in parallel with the capacitor 150b by closing a switch device 230b.

In the following, the embodiment illustrated in FIG. 5 is described by means of an illustrative example. In the example, the capacitances of the capacitors 150a and 150b are both equal to $C_{150}$, the capacitances of the capacitors 160a and 160b are both equal to $C_{160}$, and the capacitances of the capacitors 225a and 225b are both equal to $C_{225}$. Furthermore, a control variable b is used for controlling the switch devices 230a and 230b. The control variable b is set to the integer value 1 in order to close the switch devices 230a and 230b, and to the integer value 0 in order to open the switch devices 230a and 230b. The resulting voltage gain of the PGA is $-(C_{150}+bC_{225})/C_{160}$. Hence, by setting the variable b, the PGA can be programmed to use one of two available voltage gain values.

For each of the capacitors 150a and 150b, the embodiment of the main amplification unit illustrated in FIG. 5 comprises a single additional capacitor 225a and 225b that can be selectively connected in parallel with the capacitor 150a or 150b. According to some embodiments, the main amplification unit 135 may comprise more than one additional capacitor (not shown) for each of the capacitors 150a and 150b that may be selectively connected in parallel with the capacitor 150a or 150b for providing an increased number of available gain levels in the PGA.

Additionally or alternatively, the main amplification unit 125 may comprise capacitors (not shown) that may be selectively connected in parallel with the capacitors 160a and 160b for adjusting the gain of the PGA.

According to some embodiments, the refresh units 130a and 130b may be appropriately modified to account for the additional capacitors included in the main amplification unit. For example, with reference to the embodiments of the refresh units 130a and 130b illustrated in FIG. 3, for each additional capacitor in the main amplification unit that may be selectively connected in parallel with the capacitor 150a, the refresh unit 130a may comprise an additional capacitor (not shown) that is arranged to be selectively connected in parallel with the capacitor 165a when and only when said additional capacitor in the main amplification unit 125 is connected in parallel with the capacitor 150a. The ratio between the capacitance of said additional capacitor in the refresh unit 130a and the capacitance of the capacitor 165a may e.g. be equal to the ratio between the capacitance of said additional capacitor in the main amplification unit 125 and the capacitance of the capacitor 150a.

Similarly, for each additional capacitor in the main amplification unit that may be selectively connected in parallel with the capacitor 150b, the refresh unit 130b may comprise an additional capacitor (not shown) that is arranged to be selectively connected in parallel with the capacitor 165b when and only when said additional capacitor in the main amplification unit 125 is connected in parallel with the capacitor 150b. The ratio between the capacitance of said additional capacitor in the refresh unit 130b and the capacitance of the capacitor 165b may e.g. be equal to the ratio between the capacitance of said additional capacitor in the main amplification unit 125 and the capacitance of the capacitor 150b.

Furthermore, for each additional capacitor in the main amplification unit that may be selectively connected in parallel with the capacitor 160a, the refresh unit 130a may comprise an additional capacitor (not shown) that is arranged to be selectively connected in parallel with the capacitor 175a when and only when said additional capacitor in the main amplification unit 125 is connected in parallel with the capacitor 160a. The ratio between the capacitance of said additional capacitor in the refresh unit 130a and the capacitance of the capacitor 175a may e.g. be equal to the ratio between the capacitance of said additional capacitor in the main amplification unit 125 and the capacitance of the capacitor 160a.

Similarly, for each additional capacitor in the main amplification unit that may be selectively connected in parallel with the capacitor 160b, the refresh unit 130b may comprise an additional capacitor (not shown) that is arranged to be selectively connected in parallel with the capacitor 175b when and only when said additional capacitor in the main amplification unit 125 is connected in parallel with the capacitor 160b. The ratio between the capacitance of said additional capacitor in the refresh unit 130b and the capacitance of the capacitor 175b may e.g. be equal to the ratio between the capacitance of said additional capacitor in the main amplification unit 125 and the capacitance of the capacitor 160b.

In the embodiments of the fully differential gain circuit 120 described so far with reference to FIGS. 3-5, the refresh units 130a and 130b are arranged to operate simultaneously to refresh the charges associated with negative input terminal 140b and the positive input terminal 140a, respectively, of the amplifier 135. According to other embodiments, the refresh units 130a and 130b may be arranged to operate during different time intervals. For example, the refresh units 130a and 130b may be arranged to operate in a time-interleaved manner during every other refresh interval.

A switch device, such as the switch devices 85, 90, 180a-b, 185a-b, 190a-b, 195a-b, 200a-b, 205a-b, 207a-b, 215a-b, 220a-b, 230a-b, 295, and 300 shown in FIGS. 2-6, may e.g. be implemented with one or more transistors. For example, the switch device may comprise a MOS transistor, such as an NMOS or a PMOS transistor. The switch device may e.g. be implemented with a transmission gate. The transmission gate may e.g. comprise an NMOS transistor in parallel with a PMOS transistor.

Capacitors may e.g. be implemented as parallel-plate capacitors. For example, a parallel-plate capacitor may be implemented on an integrated circuit with a first conducting layer of metal or polycrystalline silicon (poly) and a second conducting layer of metal or poly separated by an insulating layer of oxide, e.g. silicon dioxide.

The capacitors 65 and 75 in the refresh unit 30 (FIG. 1) may e.g. be designed to have considerably smaller capacitance than the capacitors 50 and 60, respectively, of the main amplification unit 25. Similarly, the capacitors 165a, 175a, 165b, and 175b of the refresh units 130a and 130b (FIG. 3) may be designed to have considerably smaller capacitance than the capacitors 150a, 160a, 150b, and 160b, respectively, of the main amplification unit 125. A similar consideration is valid for the embodiment illustrated in FIG. 4, replacing the capacitances of the capacitors 165a and 165b with the sum of the capacitances of the capacitors 165'a and 210a and the sum of the capacitances of the capacitors 165'b and 210b, respectively. Hence, the circuit areas required for the refresh units 30 (FIG. 2), 130a, and 130b (FIGS. 3-4) may be relatively small, e.g. compared with the circuit areas required for the main amplification units 35 (FIG. 2) and 135 (FIG. 3-4).

According to some embodiments, the gain circuit 20 (FIG. 2) or 120 (FIGS. 3-4) may be comprised in an analog-to-digital converter (ADC). The gain circuit 20 or 120 may e.g. be arranged as a preamplifier for amplifying an analog input signal of the ADC before sampling.

Figure 6:
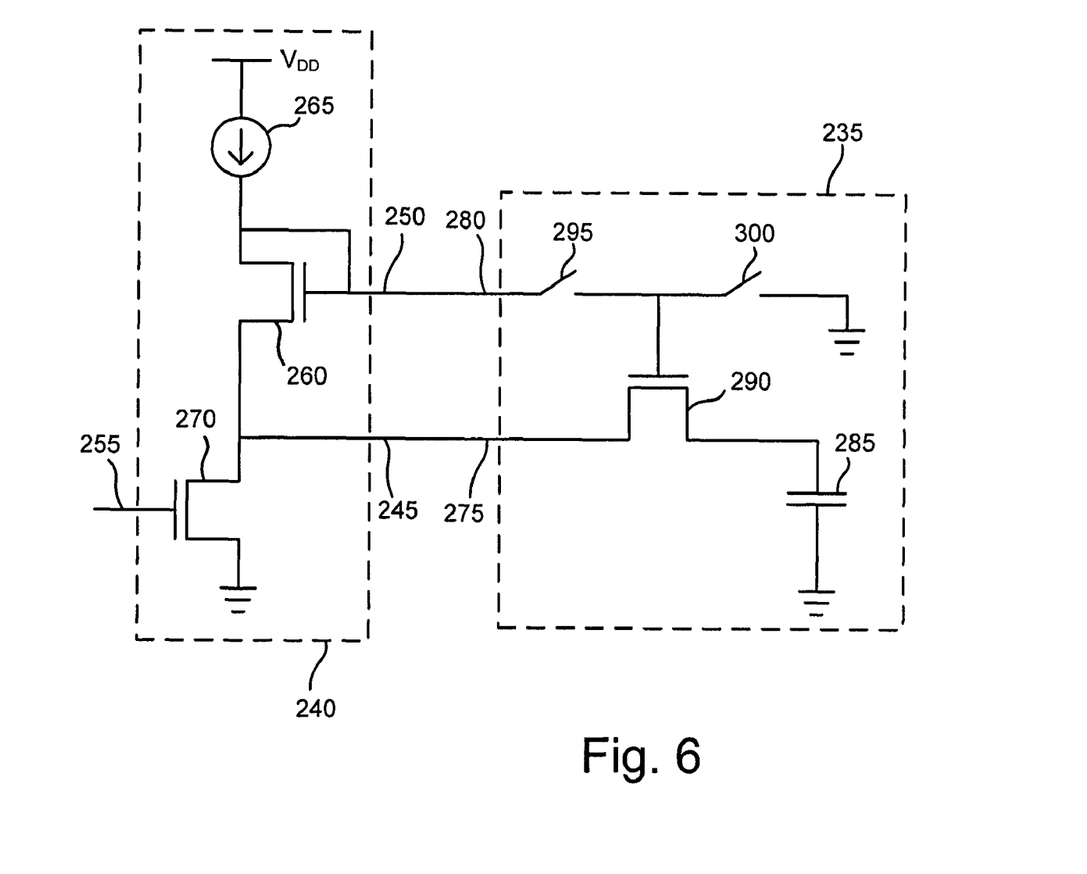
FIG. 6 is a circuit diagram of part of an analog-to-digital converter.

FIG. 6 is a circuit diagram of part of an ADC according to an embodiment. The circuit diagram in FIG. 6 shows a track-and-hold (T&H) circuit 235 of the ADC and an output stage 240 of an amplifier in the ADC. The amplifier output stage 240 may e.g. be an output stage of the amplifier 35 (FIG. 2) or 135 (FIGS. 3-5). The amplifier output stage 240 has an output terminal 245. The output terminal 245 may e.g. be the output terminal 45 of the amplifier 35 (FIG. 2) or any of the output terminals 145a and 145b of the amplifier 135 (FIGS. 3-5). The amplifier output stage 240 comprises a load circuit comprising a diode-connected NMOS transistor 260, which is biased with a DC current from a current source 265 in the load circuit of the amplifier output stage. The current source 265 may e.g. be implemented with one or more transistors in ways well known to a person skilled in the art of analog electronic circuit design. The transistor 260 is connected with its source terminal to the output terminal 245. Furthermore, the gate terminal of the transistor 260 is connected to a control-voltage output terminal 250 of the amplifier output stage 250. In the embodiment illustrated in FIG. 6, the amplifier output stage 240 is a common-source stage and comprises an NMOS transistor 270 connected to an input terminal 255 of the amplifier output stage 240 with its gate terminal. The drain terminal of the NMOS transistor 270 is connected to the output terminal 245 of the amplifier output stage. According to some embodiments, intervening components, e.g. resistors, one or more cascode transistors, etc., may be arranged between the drain terminal of the NMOS transistor 270 and the output terminal 245 of the amplifier output stage 240. According to other embodiments, the amplifier output stage may be of another type than a common-source stage, e.g. a common-drain stage, a common-gate stage, a common-emitter stage, a common-collector stage, a common base stage, etc.

In the embodiment illustrated in FIG. 6, the T&H circuit 235 is connected with an input terminal 275 of the T&H circuit 235 to the output terminal 245 of the amplifier output stage 240 and with a control-voltage input terminal 280 of the T&H circuit 235 to the control-voltage output terminal 250 of the amplifier output stage. Furthermore, the T&H circuit 235 comprises a switch transistor 290 of the NMOS type and a sampling capacitor 285. Moreover, the T&H circuit 235 comprises switch devices 295 and 300. The switch device 295 is arranged to be closed during a track phase of the T&H circuit 235 and open during a hold phase of the T&H circuit 235. The switch device 300 is arranged to be open during the track phase and closed during the hold phase. Hence, during the track phase, the diode-connected transistor generates a control voltage to the switch transistor 290 on the gate terminal of the diode-connected transistor 260. With the arrangement shown in FIG. 6, the transistors 260 and 290 are given approximately the same threshold voltages and approximately the same source voltages. Furthermore, since the transistor 260 is biased with a DC current, the control voltage generated on the gate terminal of the transistor 260 provides a channel charge in the switch transistor 290 that is approximately constant during each track phase and approximately the same for all track phases. Thereby, the diode-connected transistor 260 is operable to linearize the switch transistor 290 and facilitate signal sampling with a relatively small amount of nonlinear distortion. This type of linearization with a diode-connected transistor biased with a DC current is described in more detail in EP 1 821 313.

The embodiment illustrated in FIG. 6 is only an example used for illustration. For example, according to other embodiments, the amplifier output stage may be of another type than a common-source stage, e.g. a common-drain stage, a common-gate stage, a common-emitter stage, a common-collector stage, a common base stage, etc. As another example, a complementary circuit may be employed, wherein all NMOS transistors are replaced with PMOS transistors, all PMOS transistors (e.g. in the current source 265) are replaced with NMOS transistors, all connections to ground and supply voltage $V_{DD}$ are interchanged.

According to some embodiments, the gain circuit 20 (FIG. 2) or 120 (FIGS. 3-5) may be comprised in an integrated circuit.

According to some embodiments, the gain circuit 20 (FIG. 2) or 120 (FIGS. 3-5) may be comprised in an electronic apparatus. For example, the electronic apparatus may comprise an integrated circuit and/or an ADC that in turn comprises the gain circuit 20 and/or 120. As nonlimiting examples, the electronic apparatus may be a television set, a liquid-crystal display, a computer monitor, a digital camera, a projector, or a radio receiver.

The present invention has been described above with reference to specific embodiments. However, other embodiments than the above described are possible within the scope of the invention. The different features of the embodiments may be combined in other combinations than those described. The scope of the invention is only limited by the appended patent claims.

The invention claimed is:

1. A gain circuit comprising:
   a main amplification unit including:
      an amplifier;
      a first capacitor connected between a first input terminal of the gain circuit and a first input terminal of the amplifier;
      a second capacitor connected between the first input terminal of the amplifier and a first output terminal of the amplifier; and
   a first refresh unit including:
      a first refresh capacitor connected with a first terminal of the first refresh capacitor to a common node of the first refresh unit; and a second refresh capacitor connected with a first terminal of the second refresh capacitor to the common node of the first refresh unit; wherein the common node of the first refresh unit is arranged to be supplied with a reference voltage during a first phase of a refresh interval and connected to the first input terminal of the amplifier during a second phase of the refresh interval;

a second terminal of the first refresh capacitor of the first refresh unit is arranged to be supplied with an input voltage of the gain circuit during the first phase of the refresh interval and connected to the first input terminal of the gain circuit during the second phase of the refresh interval; and a second terminal of the second refresh capacitor of the first refresh unit is arranged to be supplied with a first voltage, which is an output voltage or output reference voltage of the amplifier, during the first phase of the refresh interval and connected to the first output terminal of the amplifier during the second phase of the refresh interval.

2. The gain circuit according to claim 1, wherein the gain circuit is single ended, said input voltage supplied to the second input terminal of the first refresh capacitor is the voltage on the first input terminal of the gain circuit, and said first voltage supplied to the second terminal of the second refresh capacitor is the voltage on the first output terminal of the amplifier.

3. The gain circuit according to claim 1, wherein the gain circuit is fully differential.

4. A gain circuit comprising:
a main amplification unit including an amplifier, a first capacitor coupled between a first input terminal of the gain circuit and a first input terminal of the amplifier, a second capacitor coupled between the first input terminal of the amplifier and a first output terminal of the amplifier, a third capacitor coupled between a second input terminal of the gain circuit and a second input terminal of the amplifier, and a fourth capacitor coupled between the second input terminal of the amplifier and a second output terminal of the amplifier;
a first refresh unit including a first refresh capacitor having a first terminal coupled to a common node of the first refresh unit, and a second refresh capacitor having a first terminal coupled to the common node of the first refresh unit;
wherein the common node of the first refresh unit is arranged to be supplied with a reference voltage during a first phase of a refresh interval and coupled to the first input terminal of the amplifier during a second phase of the refresh interval;
wherein a second terminal of the first refresh capacitor is arranged to be supplied with an input voltage of the gain circuit during the first phase of the refresh interval and coupled to the first input terminal of the gain circuit during the second phase of the refresh interval; and
wherein a second terminal of the second refresh capacitor is arranged to be supplied with a first voltage, which is an output voltage or output reference voltage of the amplifier, during the first phase of the refresh interval and coupled to the first output terminal of the amplifier during the second phase of the refresh interval; and
a second refresh unit including a third refresh capacitor having a first terminal coupled to a common node of the second refresh unit and a fourth refresh capacitor having a first terminal coupled to the common node of the second refresh unit;

wherein the common node of the second refresh unit is arranged to be supplied with a second reference voltage during the first phase of the refresh interval and coupled to the second input terminal of the amplifier during a second phase of the refresh interval;
wherein a second terminal of the third refresh capacitor is arranged to be supplied with the input voltage of the gain circuit during the first phase of the refresh interval and coupled to the second input terminal of the gain circuit during the second phase of the refresh interval; and
wherein a second terminal of the fourth refresh capacitor is arranged to be supplied with a second voltage, which is the output voltage or the output reference voltage of the amplifier during the first phase of the refresh interval and coupled to the second output terminal of the amplifier during the second phase of the refresh interval.

5. The gain circuit according to claim 4, wherein said first voltage supplied to the second terminal of the second refresh capacitor in the first refresh unit and said second voltage supplied to the second terminal of the fourth refresh capacitor in the second refresh unit are both a common-mode output voltage of the amplifier.

6. The gain circuit according to claim 4, wherein said input voltage supplied to the second terminal of the first refresh capacitor in the first refresh unit and said input voltage supplied to the second terminal of the third refresh capacitor in the second refresh unit are both a common-mode input voltage of the gain circuit.

7. The gain circuit according to claim 4, wherein
said input voltage supplied to the second terminal of the first refresh capacitor in the first refresh unit is the voltage on the first input terminal of the gain circuit; and
said input voltage supplied to the second terminal of the third refresh capacitor in the second refresh unit is the voltage on the second input terminal of the gain circuit.

8. The gain circuit according to claim 7, wherein
the first refresh unit comprises a fifth refresh capacitor connected with a first terminal of the fifth refresh capacitor to the common node of the first refresh unit, and a second terminal of the fifth refresh capacitor is arranged to be supplied with the voltage on the second input terminal of the gain circuit during the first phase of the refresh interval and coupled to the first input terminal of the gain circuit during the second phase of the refresh interval; and
the second refresh unit comprises a sixth refresh capacitor coupled with a first terminal of the sixth refresh capacitor to the common node of the second refresh unit, and a second terminal of the sixth refresh capacitor is arranged to be supplied with the voltage on the first input terminal of the gain circuit during the first phase of the refresh interval and coupled to the second input terminal of the gain circuit during the second phase of the refresh interval.

9. The gain circuit according to claim 1, wherein the ratio between the capacitance of the first capacitor and the capacitance of the second capacitor is essentially equal to the ratio between the capacitance of the first refresh capacitor and the capacitance of the second refresh capacitor.

10. The gain circuit according to claim 4, wherein
the ratio between the capacitance of the first capacitor and the capacitance of the second capacitor is essentially equal to the ratio between the capacitance of the first refresh capacitor and the capacitance of the second refresh capacitor; and
the ratio between the capacitance of the third capacitor and the capacitance of the fourth capacitor is essentially equal to the ratio between the capacitance of the third refresh capacitor and the capacitance of the fourth refresh capacitor.

11. The gain circuit according to claim 8, wherein
the ratio between the capacitance of the first capacitor and the capacitance of the second capacitor is essentially equal to the ratio between the sum of the capacitances of the first and fifth refresh capacitors and the capacitance of the second refresh capacitor; and
the ratio between the capacitance of the third capacitor and the capacitance of the fourth capacitor is essentially equal to the ratio between the sum of the capacitances of the third and sixth refresh capacitors and the capacitance of the fourth refresh capacitor.

12. The gain circuit according to claim 4, wherein the gain circuit is a programmable-gain amplifier and the main amplification unit comprises additional capacitors that may be selectively connected in parallel with the first, second, third, and/or fourth capacitor of the main amplification unit for adjusting the gain of the gain circuit.

13. The gain circuit according to claim 1, wherein the gain circuit is included in an analog-to-digital converter.

14. The gain circuit according to claim 13, further comprising:
a track-and-hold circuit having an input terminal connected to the first output terminal of the amplifier in the main amplification unit of the gain circuit; wherein
said amplifier comprises an output load circuit comprising a diode connected transistor connected to the first output terminal and biased with a DC current;
the track-and-hold circuit comprises a switch transistor of the same type as the diode-connected transistor; and
said diode-connected transistor is arranged to generate a control voltage to the switch transistor during a track phase of the track-and-hold circuit on a gate terminal of the diode-connected transistor.

15. The gain circuit according to claim 1, wherein the gain circuit is included in an integrated circuit.

16. The gain circuit according to claim 1, wherein the gain circuit is included in an electronic apparatus.

17. The gain circuit according to claim 16, wherein the electronic apparatus is a television set, a liquid-crystal display, a computer monitor, a digital camera, a projector, or a radio receiver.

18. A gain circuit comprising:
a main amplification unit including an amplifier, a first capacitor coupled between a first input terminal of the gain circuit and a first input terminal of the amplifier, and a second capacitor coupled between the first input terminal of the amplifier and a first output terminal of the amplifier;
a first refresh unit including a first refresh capacitor switchably coupled between the first input terminal of the gain circuit and a first common node, and a second refresh capacitor switchably coupled between the first output terminal of the amplifier and the first common node; wherein
in a first phase of a refresh interval, the first common node is supplied with a reference voltage, and wherein in a second phase of the refresh interval, the first common node is coupled to the first input terminal of the amplifier.

19. The gain circuit according to claim 18, wherein the main amplification unit further includes:
a third capacitor coupled between a second input terminal of the gain circuit and a second input terminal of the amplifier; and
a fourth capacitor coupled between the second input terminal of the amplifier and a second output terminal of the amplifier.

20. The gain circuit according to claim 19, further comprising:
a second refresh unit including a third refresh capacitor switchably coupled between the first input terminal of the gain circuit and a second common node, and a fourth refresh capacitor switchably coupled between the first output terminal of the amplifier and the second common node;
wherein in the first phase of the refresh interval, the second common node is supplied with a reference voltage, and wherein in the second phase of the refresh interval, the second common node is coupled to the first input terminal of the amplifier.

21. A gain circuit comprising:
a main amplification unit including an amplifier, a first capacitor coupled between a first input terminal of the gain circuit and a first input terminal of the amplifier, a second capacitor coupled between the first input terminal of the amplifier and a first output terminal of the amplifier, a third capacitor coupled between a second input terminal of the gain circuit and a second input terminal of the amplifier, and a fourth capacitor coupled between the second input terminal of the amplifier and a second output terminal of the amplifier;
a first refresh unit including a first refresh capacitor and a second refresh capacitor each having a first terminal coupled to a common node of the first refresh unit;
wherein the common node of the first refresh unit is arranged to be supplied with a reference voltage during a first phase of a refresh interval and coupled to the first input terminal of the amplifier during a second phase of the refresh interval;
wherein a second terminal of the first refresh capacitor is arranged to be supplied with an input voltage of the gain circuit during the first phase of the refresh interval and coupled to the first input terminal of the gain circuit during the second phase of the refresh interval; and
wherein a second terminal of the second refresh capacitor is arranged to be supplied with a first voltage, which is an output voltage or output reference voltage of the amplifier, during the first phase of the refresh interval and coupled to the first output terminal of the amplifier during the second phase of the refresh interval; and
a second refresh unit including a third refresh capacitor and a fourth refresh capacitor each having a first terminal coupled to a common node of the second refresh unit;
wherein the common node of the second refresh unit is arranged to be supplied with a second reference voltage during the first phase of the refresh interval and coupled to the second input terminal of the amplifier during a second phase of the refresh interval;
wherein a second terminal of the third refresh capacitor is arranged to be supplied with the input voltage of the gain circuit during the first phase of the refresh interval and coupled to the second input terminal of the gain circuit during the second phase of the refresh interval; and
wherein a second terminal of the fourth refresh capacitor is arranged to be supplied with a second voltage, which is the output voltage or the output reference voltage of the amplifier during the first phase of the refresh interval and coupled to the second output terminal of the amplifier during the second phase of the refresh interval.

* * * * *